United States Patent
Iwayama et al.

(10) Patent No.: US 7,919,826 B2
(45) Date of Patent: Apr. 5, 2011

(54) MAGNETORESISTIVE ELEMENT AND MANUFACTURING METHOD THEREOF

(75) Inventors: Masayoshi Iwayama, Kawasaki (JP); Yoshiaki Asao, Sagamihara (JP); Takeshi Kajiyama, Yokohama (JP); Keiji Hosotani, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 462 days.

(21) Appl. No.: 12/108,093

(22) Filed: Apr. 23, 2008

(65) Prior Publication Data

US 2008/0265347 A1    Oct. 30, 2008

(30) Foreign Application Priority Data

Apr. 24, 2007  (JP) ................. 2007-114315
Apr. 15, 2008  (JP) ................. 2008-106058

(51) Int. Cl.
     *H01L 21/00* (2006.01)
(52) U.S. Cl. ............ 257/421; 257/295; 365/148
(58) Field of Classification Search .......... 257/421, 257/295; 365/148
     See application file for complete search history.

(56) References Cited

U.S. PATENT DOCUMENTS

| | | | | |
|---|---|---|---|---|
| 6,656,604 B2* | 12/2003 | Hasewaga | .................. | 428/611 |
| 6,762,916 B2* | 7/2004 | Aoki et al. | ............... | 360/324.12 |
| 6,829,161 B2* | 12/2004 | Huai et al. | ................. | 365/158 |
| 7,187,525 B2* | 3/2007 | Shimura et al. | ............ | 360/324.2 |
| 7,239,545 B2* | 7/2007 | Hosotani | ................. | 365/171 |
| 7,262,449 B2* | 8/2007 | Kajiyama | ................. | 257/295 |
| 7,327,539 B2* | 2/2008 | Saito | ................. | 360/324.1 |
| 7,372,118 B2* | 5/2008 | Asao et al. | ................. | 257/421 |
| 7,629,182 B2* | 12/2009 | Wise | ............... | 438/3 |

(Continued)

FOREIGN PATENT DOCUMENTS

| | | |
|---|---|---|
| JP | 2003-298145 | 10/2003 |
| JP | 2006-156685 | 6/2006 |
| JP | 3854839 | 9/2006 |

*Primary Examiner* — Laura M Menz
(74) *Attorney, Agent, or Firm* — Oblon, Spivak, McClelland, Maier & Neustadt, L.L.P.

(57) ABSTRACT

A magnetoresistive element includes a first stacked structure formed by sequentially stacking a first fixed layer in which a magnetization direction is fixed and a first nonmagnetic layer, a second stacked structure formed on the first stacked structure by sequentially stacking a free layer in which a magnetization direction is changeable, a second nonmagnetic layer, and a second fixed layer in which a magnetization direction is fixed, and a circumferential wall formed in contact with a circumferential surface of the second stacked structure to surround the second stacked structure, and made of an insulator. A circumferential surface of the first stacked structure is substantially perpendicular. The second stacked structure has a tapered shape which narrows upward.

14 Claims, 9 Drawing Sheets

U.S. PATENT DOCUMENTS

| | | |
|---|---|---|
| 7,706,175 B2* | 4/2010 | Hosotani et al. .............. 365/158 |
| 7,727,778 B2* | 6/2010 | Iwayama et al. ................. 438/3 |
| 7,741,688 B2* | 6/2010 | Kajiyama .................... 257/421 |
| 7,772,660 B2* | 8/2010 | Ueda ............................ 257/421 |
| 2001/0006446 A1* | 7/2001 | Aoki et al. .............. 360/324.12 |
| 2002/0024775 A1* | 2/2002 | Hasegawa .................... 360/314 |
| 2002/0054463 A1* | 5/2002 | Mukoyama et al. ..... 360/324.11 |
| 2006/0054947 A1* | 3/2006 | Asao et al. .................... 257/295 |
| 2006/0083053 A1* | 4/2006 | Hosotani ....................... 365/158 |
| 2007/0224707 A1* | 9/2007 | Hosotani .......................... 438/3 |
| 2008/0080233 A1* | 4/2008 | Hosotani et al. ............. 365/158 |
| 2008/0089118 A1* | 4/2008 | Kajiyama .................... 365/158 |
| 2008/0135958 A1* | 6/2008 | Kajiyama et al. ............ 257/421 |
| 2008/0170432 A1* | 7/2008 | Asao ............................. 365/171 |
| 2008/0203503 A1* | 8/2008 | Asao ............................. 257/421 |
| 2008/0206895 A1* | 8/2008 | Asao et al. ........................ 438/3 |
| 2008/0265347 A1* | 10/2008 | Iwayama et al. ............. 257/421 |
| 2008/0277703 A1* | 11/2008 | Iwayama ..................... 257/295 |
| 2009/0091863 A1* | 4/2009 | Hosotani et al. ........... 360/324.2 |
| 2009/0206427 A1* | 8/2009 | Oh et al. ....................... 257/421 |
| 2010/0047930 A1* | 2/2010 | Hosotani et al. .................. 438/3 |
| 2010/0053823 A1* | 3/2010 | Iwayama et al. ........... 360/324.2 |
| 2010/0103718 A1* | 4/2010 | Asao et al. ................... 365/148 |
| 2010/0232210 A1* | 9/2010 | Kajiyama et al. ............ 365/148 |

* cited by examiner

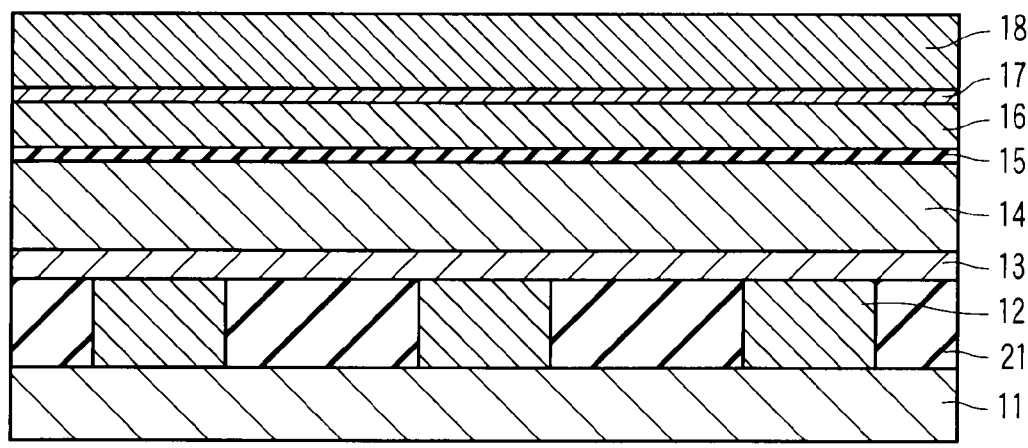
F I G. 5
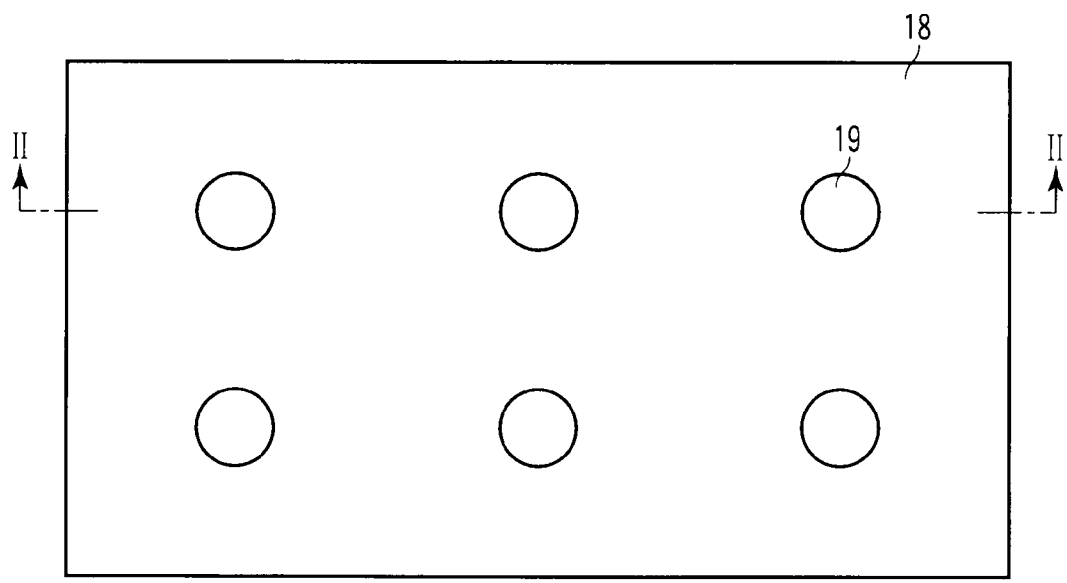
F I G. 6
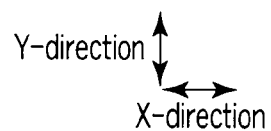

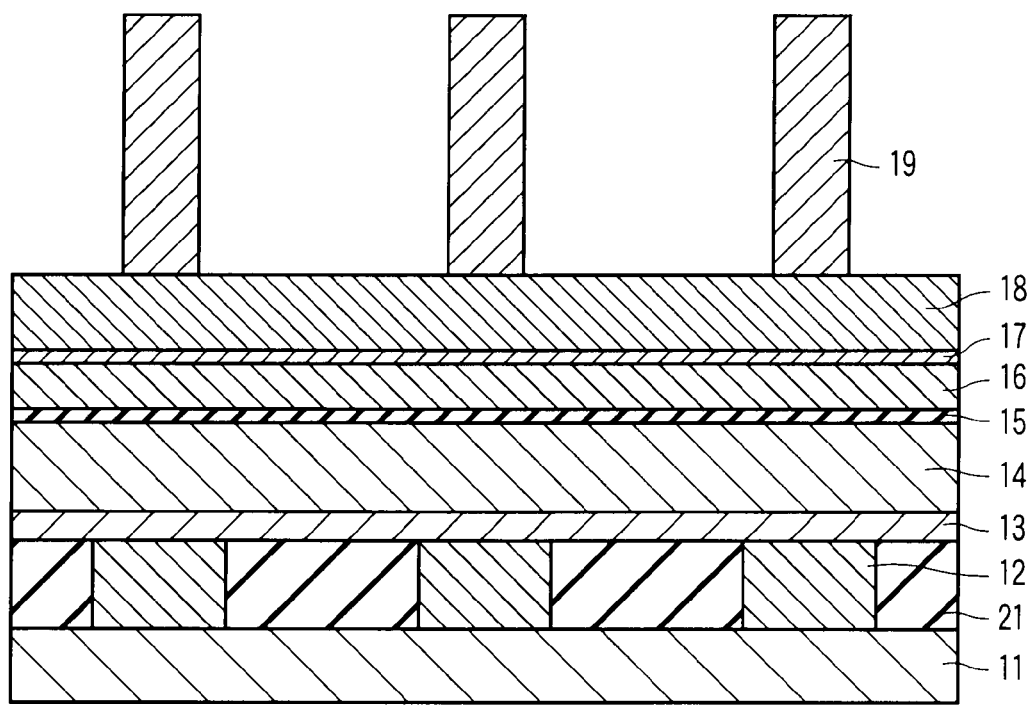
F I G. 7
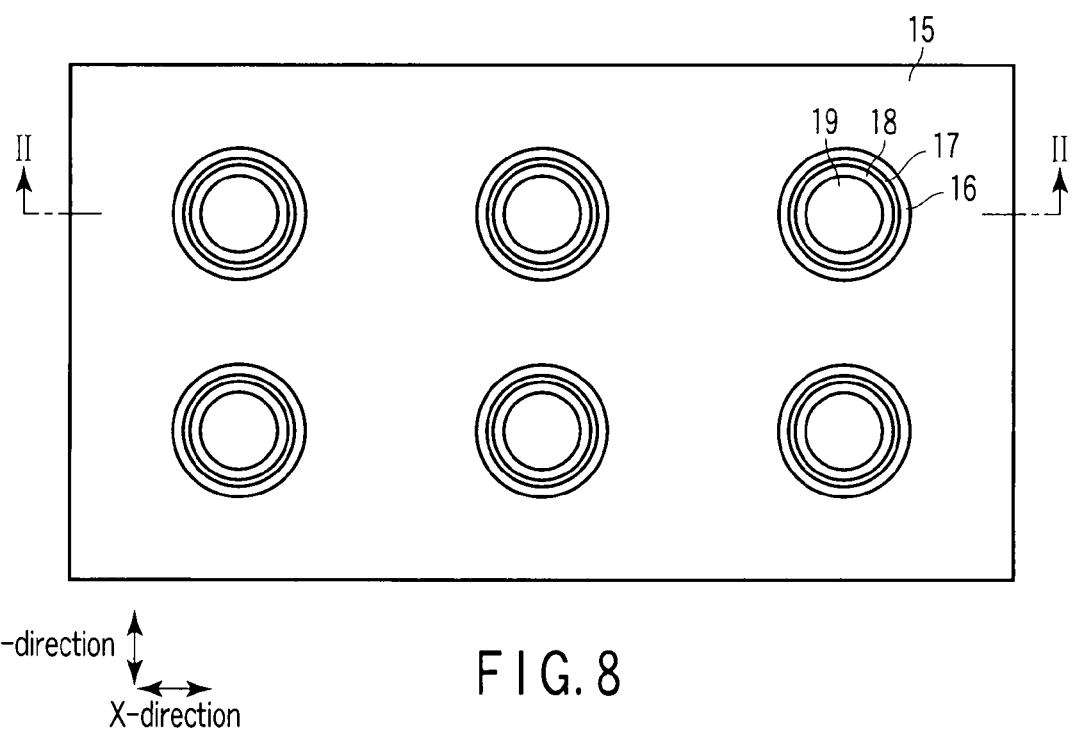
F I G. 8

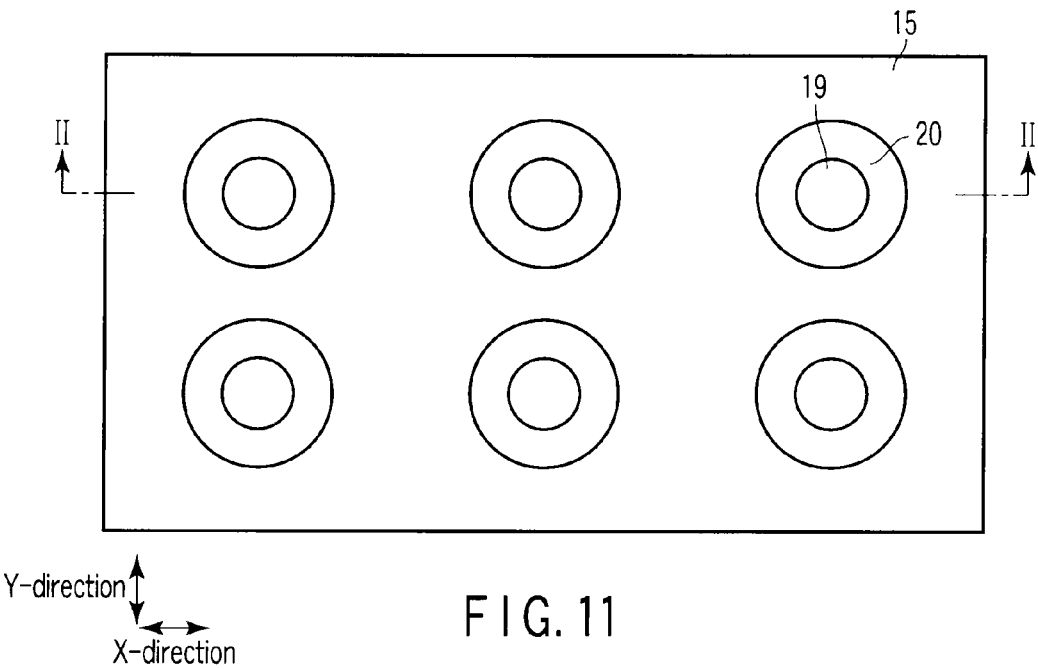
F I G. 11
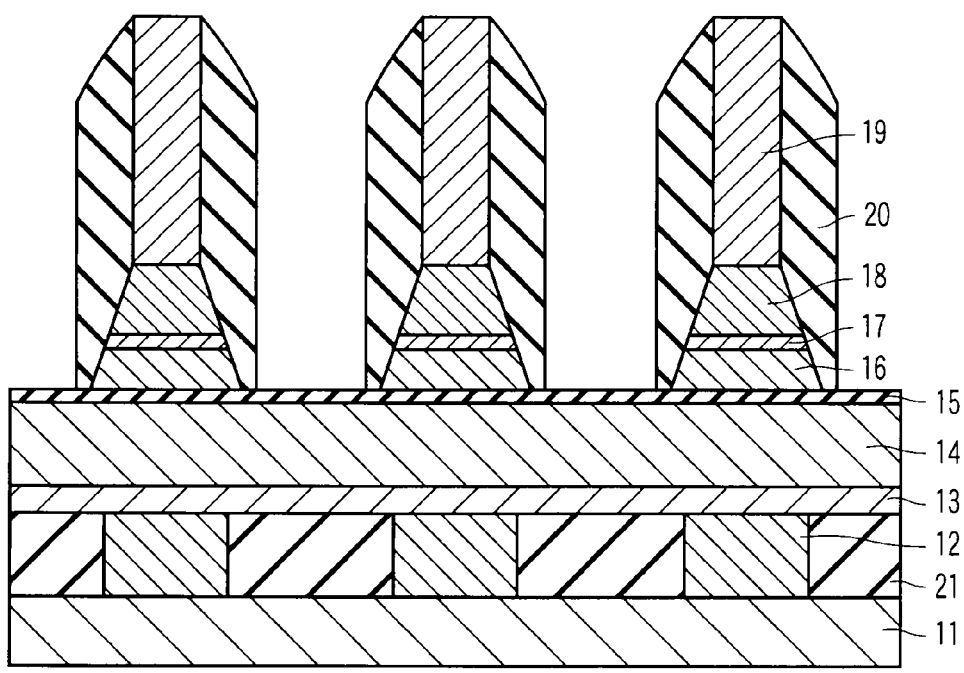
F I G. 12

US 7,919,826 B2

MAGNETORESISTIVE ELEMENT AND MANUFACTURING METHOD THEREOF

CROSS-REFERENCE TO RELATED APPLICATIONS

This application is based upon and claims the benefit of priority from prior Japanese Patent Applications No. 2007-114315, filed Apr. 24, 2007; and No. 2008-106058, filed Apr. 15, 2008, the entire contents of both of which are incorporated herein by reference.

BACKGROUND OF THE INVENTION

1. Field of the Invention

The present invention relates to a magnetoresistive element and a manufacturing method thereof, e.g., a magnetoresistive element capable of recording information by supplying an electric current in two directions, and a manufacturing method thereof.

2. Description of the Related Art

A magnetic random access memory (MRAM) using a ferromagnetic material is expected as a nonvolatile memory that achieves a high-speed operation, large capacity, and low power consumption. The MRAM includes a magnetic tunnel junction (MTJ) element using the tunneling magnetoresistive (TMR) effect as a memory element, and stores information in accordance with the magnetization state of this MTJ element.

In the conventional MRAM in which data is written by a magnetic field generated by a line electric current, the coercive force increases as the size of the MTJ element decreases. This often increases an electric current necessary for data write. In this conventional MRAM, it is difficult to achieve a small cell size for obtaining a large capacity and a low electric current at the same time.

A spin injection MRAM using the spin momentum transfer (SMT) write method as a write method for solving the above problem has been proposed. In this spin injection MRAM, information is written by directly supplying an electric current to the MTJ element, and changing the magnetization direction in a free layer in accordance with the direction of the electric current. Also, an MTJ element comprising two fixed layers sandwiching the free layer can increase the spin torque. This makes it possible to reduce the critical current density of the MTJ element.

When forming an MTJ element like this, a double magnetic tunnel junction is separated into MTJ elements in an etching step. However, the reaction product formed by etching during junction separation adheres to the side surfaces of the element, and shortcircuits the free layer and fixed layer. To avoid this shortcircuit of the free layer and fixed layer, taper etching can be performed. However, the processed sectional shape becomes a tapered shape, and the increase in etching film thickness caused by the two fixed layers increases the processing conversion difference during taper etching. This increases the MTJ element size.

As a related technique of this kind, the structure of a magnetoresistive effect element having inclined side surfaces is also disclosed (Jpn. Pat. Appln. KOKAI Publication No. 2003-298145). This magnetoresistive effect element has a magnetic domain structure that is stable even when the element size decreases.

BRIEF SUMMARY OF THE INVENTION

According to an aspect of the present invention, there is provided a magnetoresistive element comprising: a first stacked structure formed by sequentially stacking a first fixed layer in which a magnetization direction is fixed and a first nonmagnetic layer; a second stacked structure formed on the first stacked structure by sequentially stacking a free layer in which a magnetization direction is changeable, a second nonmagnetic layer, and a second fixed layer in which a magnetization direction is fixed; and a circumferential wall formed in contact with a circumferential surface of the second stacked structure to surround the second stacked structure, and made of an insulator. A circumferential surface of the first stacked structure is substantially perpendicular. The second stacked structure has a tapered shape which narrows upward.

According to an aspect of the present invention, there is provided a method of manufacturing a magnetoresistive element, comprising: forming a first stacked structure by sequentially stacking a first fixed layer in which a magnetization direction is fixed and a first nonmagnetic layer; forming a second stacked structure on the first stacked structure by sequentially stacking a free layer in which a magnetization direction is changeable, a second nonmagnetic layer, and a second fixed layer in which a magnetization direction is fixed; forming a hard mask on the second stacked structure; performing taper etching on the second stacked structure by using the hard mask as a mask; forming a circumferential wall made of an insulator on the first stacked structure and on a circumferential surface of the second stacked structure; and anisotropically etching the first stacked structure by using the circumferential wall as a mask.

BRIEF DESCRIPTION OF THE SEVERAL VIEWS OF THE DRAWING

FIG. 5 is a sectional view showing a manufacturing step of the MRAM according to the embodiment of the present invention;

FIG. 6 is a plan view showing a manufacturing step, which follows FIG. 5, of the MRAM;

FIG. 7 is a sectional view showing a manufacturing step of the MRAM taken along line II-II in FIG. 6;

FIG. 8 is a plan view showing a manufacturing step, which follows FIG. 6, of the MRAM;

FIG. 11 is a plan view showing a manufacturing step, which follows FIG. 10, of the MRAM;

FIG. 12 is a sectional view showing a manufacturing step of the MRAM taken along line II-II in FIG. 11;

DETAILED DESCRIPTION OF THE INVENTION

Figure 1:
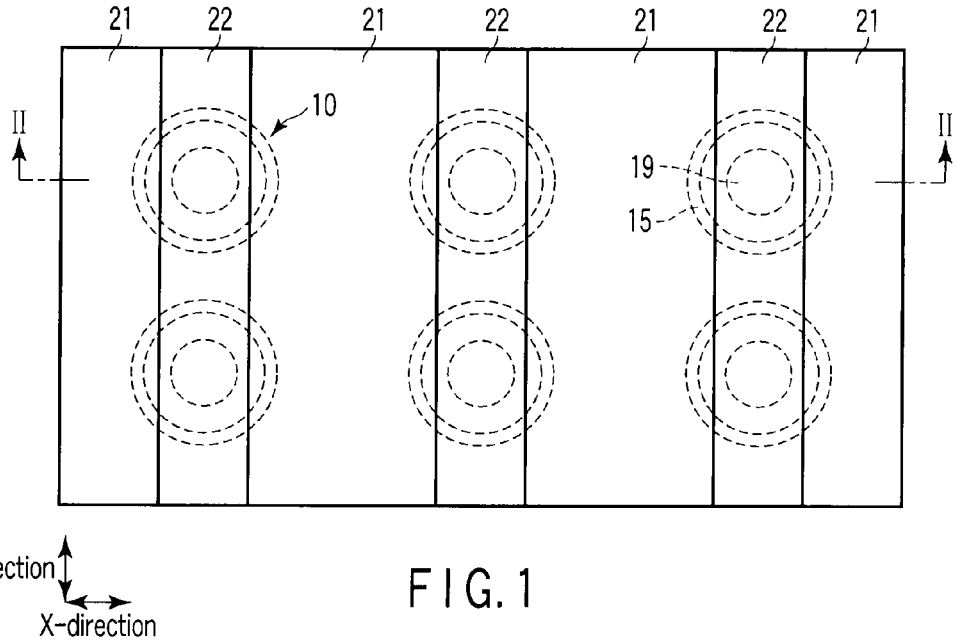
FIG. 1 is a plan view showing the arrangement of an MRAM according to an embodiment of the present invention.

An embodiment of the present invention will be explained below with reference to the accompanying drawing. Note that in the following explanation, the same reference numerals denote elements having the same functions and arrangements, and a repetitive explanation will be made only when necessary.

Figure 2:
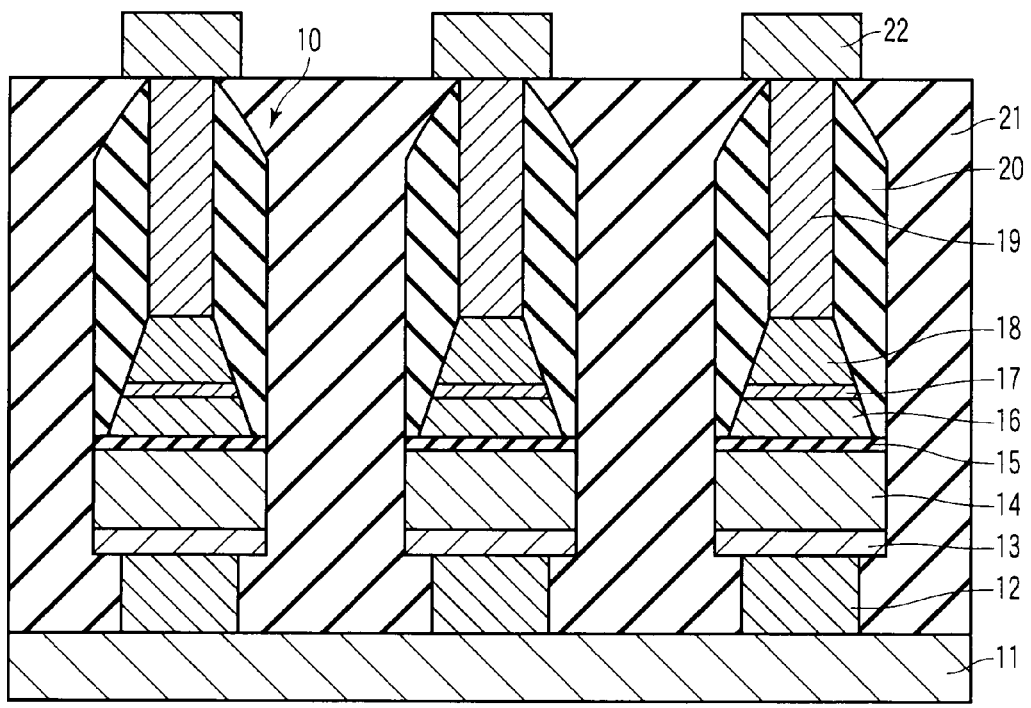
FIG. 2 is a sectional view of the MRAM taken along line II-II in FIG. 1.

FIG. 1 is a plan view showing the arrangement of an MRAM according to the embodiment of the present invention. FIG. 2 is a sectional view of the MRAM taken along line II-II in FIG. 1.

This MRAM comprises MTJ elements (magnetoresistive elements) 10. The MRAM also comprises interconnection layers 11 running in the X-direction, and interconnection layers 22 running in the Y-direction. The MTJ elements 10 are arranged at the intersections of the interconnection layers 11 and 22. The interconnection layers 11 and 22 are used to supply an electric current to the MTJ elements in two directions.

Contact plugs 12 equal in number to the MTJ elements 10 are formed on the interconnection layers 11. The MTJ element 10 has a stacked structure in which a lower electrode 13, first fixed layer (also called a pinned layer) 14, first tunnel barrier layer (nonmagnetic layer) 15, free layer (also called a recording layer) 16, second tunnel barrier layer (nonmagnetic layer) 17, second fixed layer 18, and upper electrode 19 are sequentially stacked on the contact plug 12.

That is, the MTJ element 10 of this embodiment is an example of the arrangement of a magnetoresistive element having a so-called double-junction structure (also called a dual pin structure) in which two fixed layers are formed on nonmagnetic layers on the two sides of a free layer. The planar shape of the MTJ element 10 is not particularly limited. For example, the planar shape is a circle in this embodiment. Other examples are a square, rectangle, and ellipse.

The magnetization (or spin) direction is fixed in the first and second fixed layers 14 and 18. Also, the magnetization directions in the first and second fixed layers 14 and 18 are antiparallel (opposite). In the free layer 16, the magnetization direction is changeable (reversible). The easy magnetization directions in the fixed layers 14 and 18 and free layer 16 can be perpendicular or parallel to the film surfaces. That is, the MTJ element 10 can be formed by using perpendicular magnetization films or in-plane magnetization films.

The fixed layers 14 and 18 and free layer 16 are made of ferromagnetic materials. More specifically, the fixed layers 14 and 18 are each made of a ferromagnetic material containing one or more elements selected from cobalt (Co), iron (Fe), nickel (Ni), iridium (Ir), platinum (Pt), manganese (Mn), and ruthenium (Ru). The free layer 16 is made of a ferromagnetic material containing one or more elements selected from cobalt (Co), iron (Fe), and nickel (Ni). An element such as boron (B), carbon (C), or silicon (Si) may also be added in order to adjust, e.g., the saturation magnetization or crystal magnetic anisotropy. The lower electrode 13, upper electrode 19, and contact plug 12 are made of a conductor such as tantalum (Ta).

Note that the synthetic antiferromagnet (SAF) structure may also be used as the fixed layers 14 and 18. The SAF structure is a stacked structure including a first magnetic layer/nonmagnetic layer/second magnetic layer in which the magnetization directions are antiparallel on the two sides of the nonmagnetic layer. The SAF structure can increase the magnetization fixing force in the fixed layers 14 and 18, thereby increasing the resistance and thermal stability against an external magnetic field.

The first tunnel barrier layer 15 is made of a metal oxide such as magnesium oxide or aluminum oxide. The second tunnel barrier layer 17 is made of a paramagnetic metal such as copper (Cu), gold (Au), or silver (Ag). The TMR effect can be used when the metal oxide is used as the first tunnel barrier layer 15. The giant magnetoresistive (GMR) effect can be used when the paramagnetic metal is used as the second tunnel barrier layer 17. The MR ratio of TMR is much higher than that of GMR. Accordingly, the MR ratio of TMR is mainly used in data read.

Note that the layers forming the MTJ element 10 may also be stacked in the reverse order. In this case, the paramagnetic metal is used as the first tunnel barrier layer 15, and the metal oxide is used as the second tunnel barrier layer 17. The metal oxide may also be used as both the tunnel barrier layers 15 and 17. If this is the case, the film thicknesses of the tunnel barrier layers 15 and 17 are set different from each other. This is so in order to produce an MR ratio difference in data read.

The MTJ element 10 is a spin injection magnetoresistive element. When writing data in the MTJ element 10 or reading data from it, therefore, an electric current is supplied to the MTJ element 10 in two directions perpendicular to the film surfaces (or the stacked layer surfaces). Data is written in the MTJ element 10 as follows.

When electrons are supplied from the fixed layer 14 (i.e., when electrons flow from the fixed layer 14 to the free layer 16), electrons spin-polarized in the same direction as the magnetization direction in the fixed layer 14 and electrons spin-polarized in the direction opposite to the magnetization direction in the fixed layer 18 as they are reflected by the fixed layer 18 are injected into the free layer 16. In this case, the magnetization direction in the free layer 16 is made the same as that in the fixed layer 14. As a consequence, the magnetization directions in the fixed layer 14 and free layer 16 are arranged parallel. In this parallel arrangement, the resistance of the MTJ element 10 is a minimum. This case is defined as, e.g., data "0".

On the other hand, when electrons are supplied from the fixed layer 18 (i.e., when electrons flow from the fixed layer 18 to the free layer 16), electrons spin-polarized in the same direction as the magnetization direction in the fixed layer 18 and electrons spin-polarized in the direction opposite to the magnetization direction in the fixed layer 14 as they are reflected by the fixed layer 14 are injected into the free layer 16. In this case, the magnetization direction in the free layer 16 is made opposite to that in the fixed layer 14. As a consequence, the magnetization directions in the fixed layer 14 and free layer 16 are arranged antiparallel. In this antiparallel arrangement, the resistance of the MTJ element 10 is a maximum. This case is defined as, e.g., data "1".

Next, data is read as follows. A read current is supplied to the MTJ element 10. This read current is set at a value (smaller than that of the write current) at which the magnetization direction in the free layer 16 does not reverse. A change in resistance of the MTJ element 10 in this state is detected by using a sense amplifier or the like.

As shown in FIG. 2, a first stacked structure including the lower electrode 13, fixed layer 14, and tunnel barrier layer 15 is not tapered; the circumferential surface of the first stacked structure is almost perpendicular to the film surfaces. Note that the first stacked structure is actually more or less tapered because the process limitations make perfect perpendicularity impossible. On the other hand, a second stacked structure including the free layer 16, tunnel barrier layer 17, and fixed layer 18 has a tapered shape that narrows upward. That is, the circumferential surface of the second stacked structure inclines to the perpendicular direction.

Also, the area of the bottom surface of the free layer 16 is smaller than the area of the tunnel barrier layer 15. That is, the free layer 16 and tunnel barrier layer 15 form a step. In other words, the diameter of the bottom surface of the free layer 16 is smaller than the diameter of the tunnel barrier layer 15 (or the diameter of the fixed layer 14) in the sectional shape.

Furthermore, a circumferential wall 20 surrounds the circumferential surface of a stacked structure including the free layer 16, tunnel barrier layer 17, fixed layer 18, and hard mask 19. The circumferential wall 20 is formed on the tunnel barrier layer 15. The circumferential wall 20 is made of an insulator, e.g., a silicon nitride film.

The circumferential surface of the upper electrode 19 is almost perpendicular to the film surfaces. "Almost perpendicular" herein mentioned includes a somewhat tapered shape. The area of the bottom surface of the upper electrode 19 is the same as that of the upper surface of the fixed layer 18.

Figure 3:
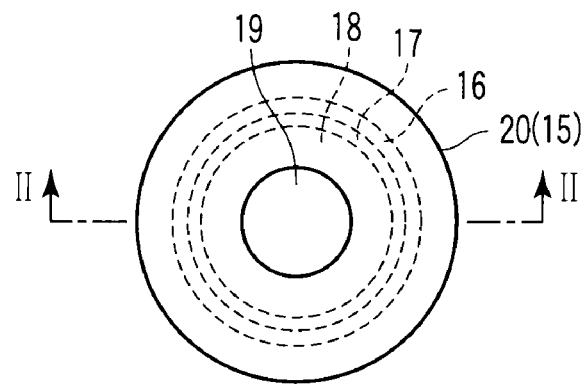
FIG. 3 is a plan view showing the arrangement of an MTJ element 10 according to the embodiment of the present invention.
Figure 4:
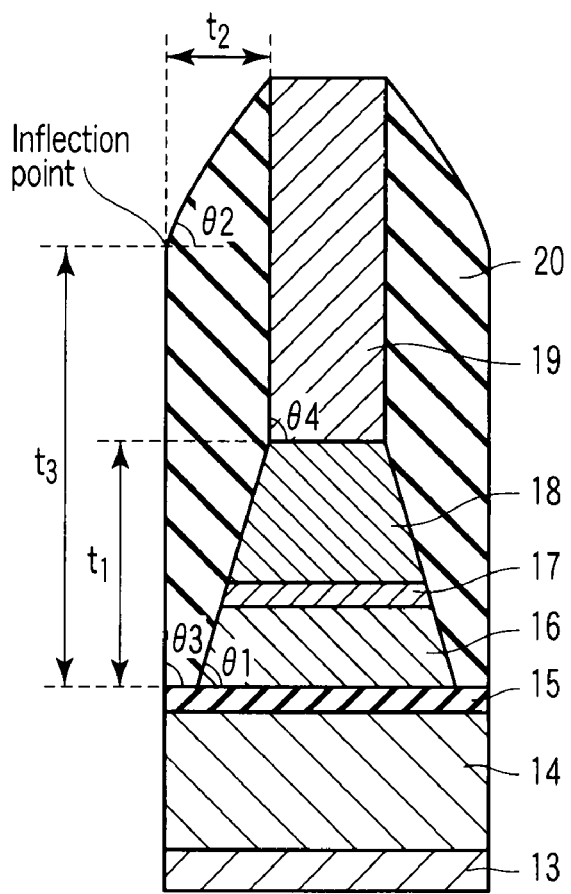
FIG. 4 is a sectional view of the MTJ element 10 taken along line II-II in FIG. 3.

FIG. 3 (plan view) and FIG. 4 (sectional view taken along line II-II) illustrate one MTJ element 10. Letting $\theta 1$ be the angle (taper angle) of the circumferential surface of the second stacked structure including the free layer 16, tunnel barrier layer 17, and fixed layer 18, and $t1$ be the film thickness of the second stacked structure, a film thickness $t2$ of the circumferential wall 20 is set to satisfy $t2 > t1/\tan\theta 1$ When this condition is met, the area of the bottom surface of the free layer 16 becomes smaller than the area of the tunnel barrier layer 15. That is, the circumferential wall 20 necessarily surrounds the circumferential surface of the free layer 16. This makes it possible to prevent a shortcircuit of the free layer 16 and fixed layer 14.

If, for example, the MTJ element 10 is entirely tapered in order to suppress shortcircuits between the magnetic layers, the size of the lower electrode 13 as the lowermost layer increases, and this increases the size of the MTJ element 10. In this embodiment, however, a shortcircuit of the free layer 16 and fixed layer 18 is suppressed by tapering the second stacked structure including the free layer 16, tunnel barrier layer 17, and fixed layer 18. On the other hand, the circumferential surface of the first stacked structure including the lower electrode 13, fixed layer 14, and tunnel barrier layer 15 is almost perpendicular to the film surfaces. Consequently, the MTJ element 10 can be downsized. In addition, the circumferential wall 20 formed on the circumferential surface of the free layer 16 prevents a shortcircuit of the free layer 16 and fixed layer 14.

Another condition under which the circumferential wall 20 surrounds the second stacked structure will be explained below. As shown in FIG. 4, letting $\theta 2$ be the taper angle of the upper portion of the circumferential wall 20, $\theta 3$ be the taper angle of the lower portion of the circumferential wall 20, and $t3$ be the distance from the upper surface of the tunnel barrier layer 15 to an inflection point at which $\theta 2 < \theta 3$, the distance $t3$ is set to satisfy $t3 > t1$.

For example, if the distance $t3$ is smaller than $t1$, the circumferential wall 20 may not be able to surround the second stacked structure. However, when formed to meet the above condition, the circumferential wall 20 necessarily surrounds the circumferential surface of the free layer 16. This makes it possible to prevent a shortcircuit of the free layer 16 and fixed layer 14.

Still another condition under which the circumferential wall 20 surrounds the second stacked structure will be explained below. Letting $\theta 4$ be the taper angle of the upper electrode 19, the taper angle $\theta 4$ is set to satisfy $\theta 4 > \theta 1$. In addition, the taper angle $\theta 3$ of the lower portion of the circumferential wall 20 is set to satisfy $\theta 3 > \theta 1$.

If the taper angle $\theta 4$ of the upper electrode 19 is almost perpendicular, the circumferential wall 20 readily surrounds the second stacked structure when formed. On the other hand, if the taper angle $\theta 4$ of the upper electrode 19 is smaller than $\theta 1$, the area of the upper surface of the upper electrode 19 decreases, or the height of the upper electrode 19 decreases. This may make the circumferential wall 20 unable to surround the second stacked structure. Also, if the taper angle $\theta 3$ of the lower portion of the circumferential wall 20 is smaller than the taper angle $\theta 1$ of the second stacked structure, the circumferential wall 20 may not be able to surround the second stacked structure. However, when the upper electrode 19 and circumferential wall 20 are formed to meet the above condition, the circumferential wall 20 necessarily surrounds the circumferential surface of the free layer 16. Consequently, a shortcircuit of the free layer 16 and fixed layer 14 can be prevented.

Note that in this embodiment, the volume of the fixed layer 18 reduces because the second stacked structure is tapered. This may make the fixed layer 18 unable to obtain the desired magnetic anisotropic energy. Therefore, the magnetic anisotropic energy per unit volume of the fixed layer 18 is preferably higher than that of the fixed layer 14. This allows the fixed layer 18 to have the desired magnetic anisotropic energy even when the volume of the fixed layer 18 is smaller than that of the fixed layer 14.

An example of a method of manufacturing the MTJ element 10 will be explained below with reference to the accompanying drawing. For example, interconnection layers 11 running in the X-direction are formed on an interlayer dielectric layer on a semiconductor substrate (not shown). Contact plugs 12 equal in number to MTJ elements 10 are formed on the interconnection layers 11. An interlayer dielectric layer 21 fills portions between the interconnection layers 11 and between the contact plugs 12. The interconnection layers 11 are made of a metal such as aluminum (Al).

Subsequently, as shown in FIG. 5, a lower electrode 13, first fixed layer 14, first tunnel barrier layer 15, free layer 16, second tunnel barrier layer 17, and second fixed layer 18 are sequentially stacked on the contact plugs 12. The fixed layers 14 and 18 and free layer 16 are made of, e.g., a Co—Fe—B alloy. The first tunnel barrier layer 15 is made of, e.g., magnesium oxide, and the second tunnel barrier layer 17 is made of, e.g., copper (Cu).

Then, as shown in FIGS. 6 and 7, hard masks 19 equal in number to MTJ elements 10 are formed on the fixed layer 18 by lithography and reactive ion etching (RIE). The planar shape of the hard mask 19 is the same as the desired planar shape of the upper surface of the fixed layer 18. In this embodiment, the planar shape of the hard mask 19 is, e.g., a circle. The hard mask 19 is made of a conductor (e.g., tantalum), and used as an upper electrode.

Figure 9:
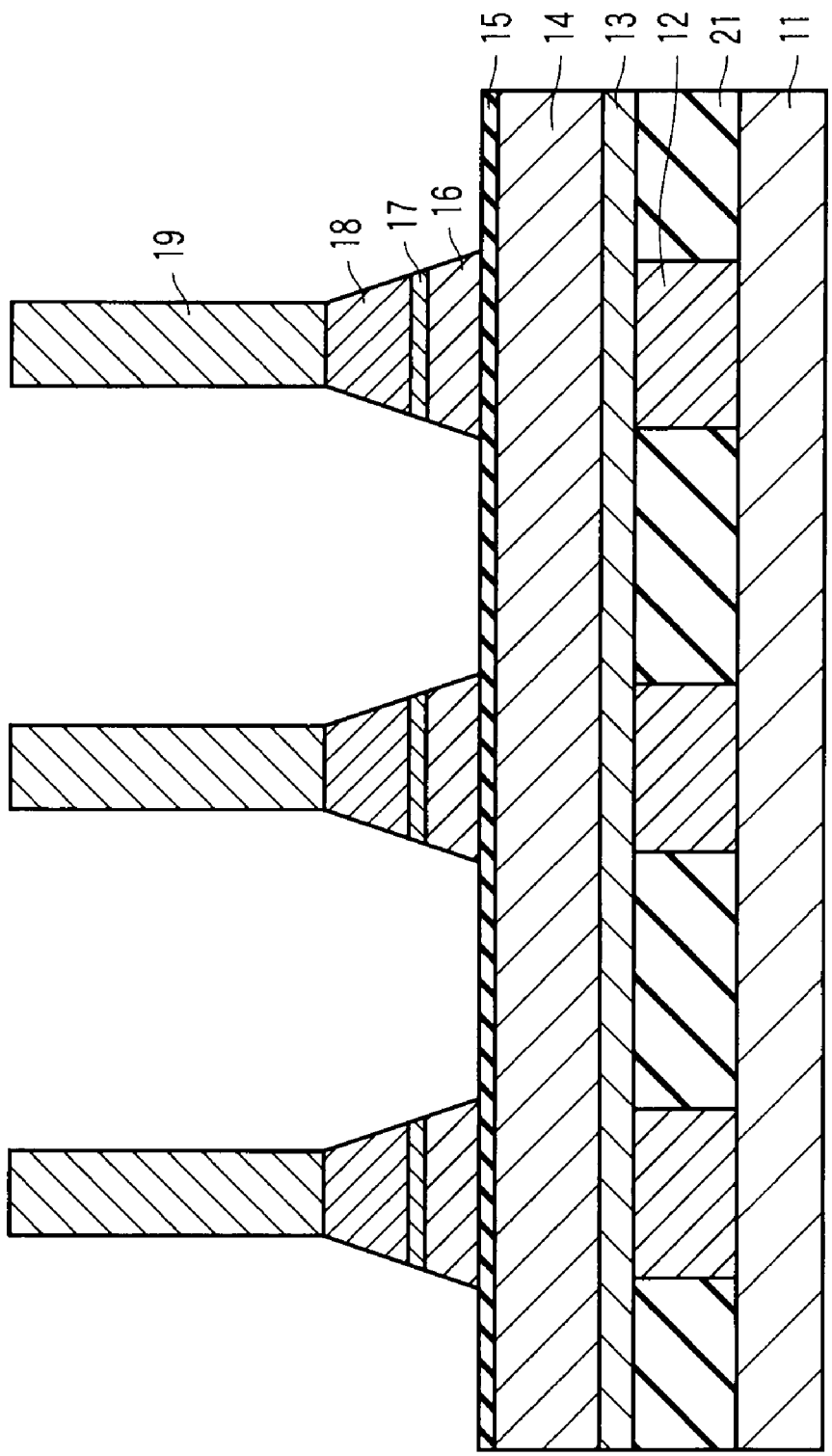
FIG. 9 is a sectional view showing a manufacturing step of the MRAM taken along line II-II in FIG. 8.

As shown in FIGS. 8 and 9, the hard masks 19 are used as masks to taper the fixed layer 18, tunnel barrier layer 17, and free layer 16 by etching by using ion milling or the like, thereby exposing the upper surface of the tunnel barrier layer 15. In this step, a second stacked structure including the fixed layer 18, tunnel barrier layer 17, and free layer 16 is given a tapered shape that narrows upward. This makes it possible to suppress a shortcircuit of the fixed layer 18 and free layer 16.

The hardness of the tunnel barrier layer 15 is preferably set higher than that of the tunnel barrier layer 17. Selecting a material meeting this condition further improves the function as an etching stopper of the tunnel barrier layer 15 in the ion milling step described above. This facilitates processing the second stacked structure.

Also, the resistance of the tunnel barrier layer 17 is preferably set lower than that of the tunnel barrier layer 15. When taper etching is performed, the reaction product (etching product) formed by etching readily adheres to the circumferential surface of the second stacked structure. When a low-resistance (high-conductivity) material is used as the tunnel barrier layer 17, however, a spin injection current flows through the tunnel barrier layer 17 even if the reaction product adheres to the circumferential surface of the second stacked structure and shortcircuits the fixed layer 18 and free layer 16. Accordingly, even if the reaction product adheres to the circumferential surface of the second stacked structure, the influence of the reaction product can be minimized.

Figure 10:
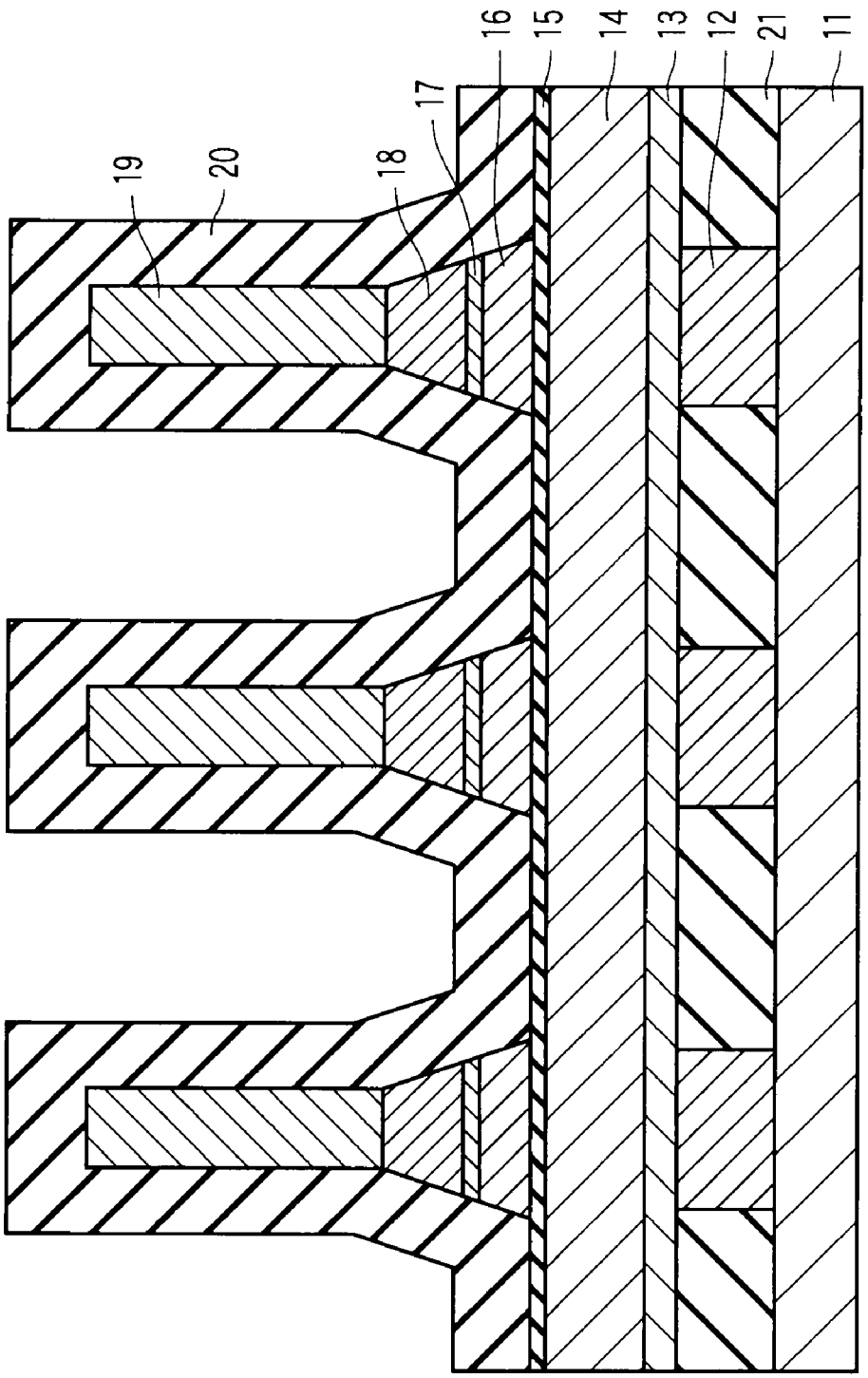
FIG. 10 is a sectional view showing a manufacturing step, which follows FIG. 9, of the MRAM.

Next, as shown in FIG. 10, an insulating layer 20 made of a silicon nitride film is deposited on the entire device surface. In this step, the insulating layer 20 is formed on the circumferential surfaces of the hard mask 19, fixed layer 18, tunnel barrier layer 17, and free layer 16. Furthermore, the film thickness of the insulating layer 20 is set to satisfy the above-mentioned relation.

As shown in FIGS. 11 and 12, the insulating layer 20 is anisotropically etched by RIE having strong anisotropy, thereby exposing the upper surface of the tunnel barrier layer 15. Consequently, a circumferential wall 20 is formed on the circumferential surfaces of the hard mask 19, fixed layer 18, tunnel barrier layer 17, and free layer 16. The insulating layer 20 partially remains on the tunnel barrier layer 15 because the film thickness of the insulating layer 20 is set to satisfy the above-mentioned relation.

Figure 13:
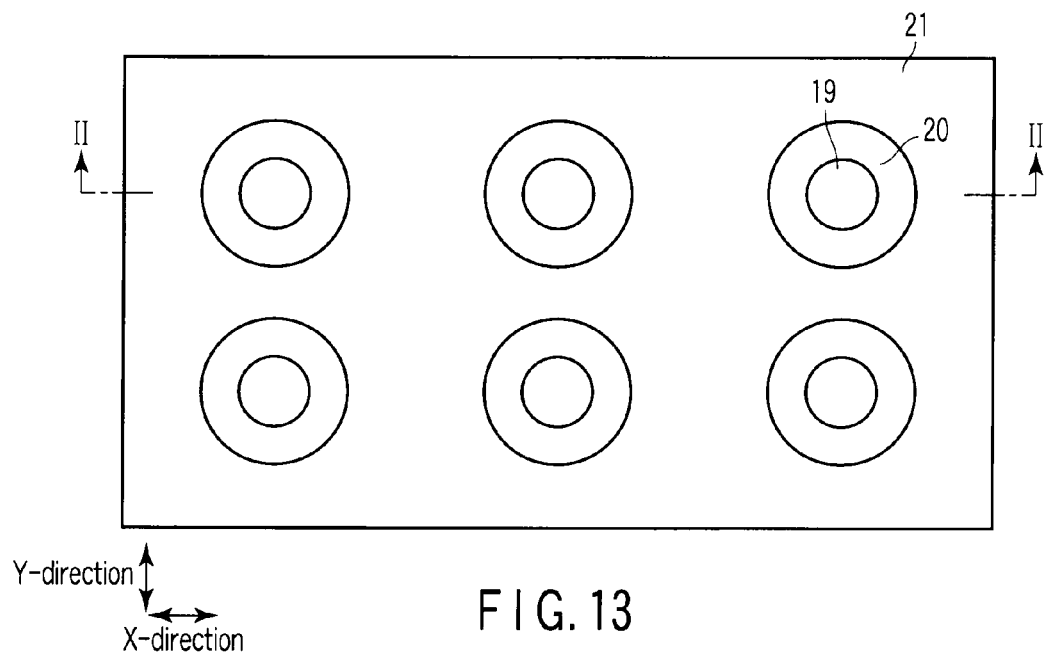
FIG. 13 is a plan view showing a manufacturing step, which follows FIG. 11, of the MRAM.
Figure 14:
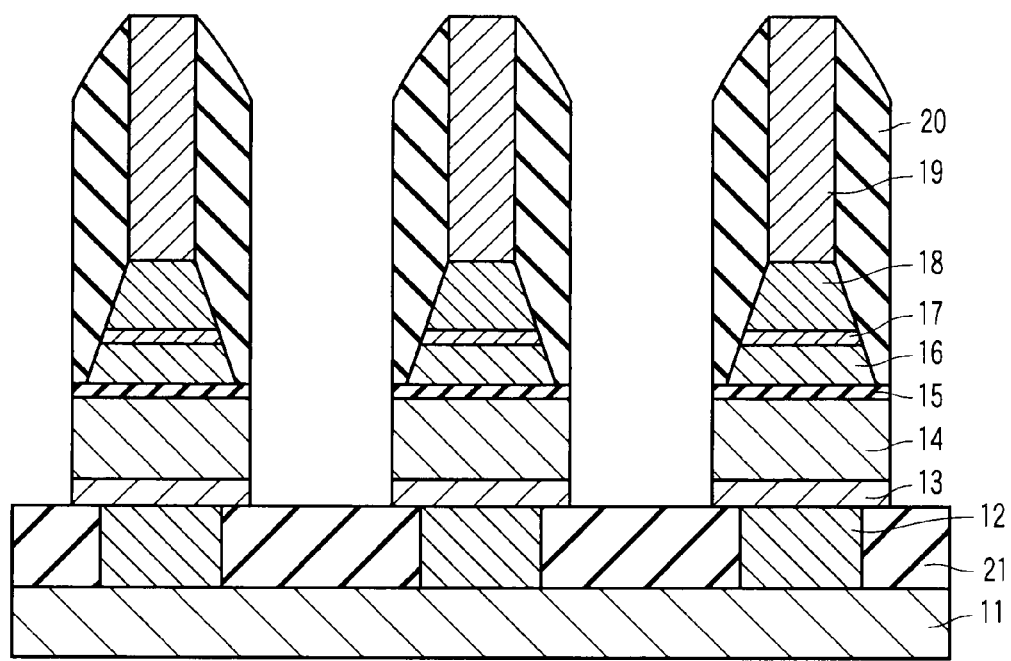
FIG. 14 is a sectional view showing a manufacturing step of the MRAM taken along line II-II in FIG. 13.

Subsequently, as shown in FIGS. 13 and 14, the circumferential wall 20 is used as a mask to etch the tunnel barrier layer 15, fixed layer 14, and lower electrode 13 by RIE having strong anisotropy such that their circumferential surfaces are almost perpendicular, thereby exposing the upper surface of the interlayer dielectric layer 21. In this step, it is possible to prevent the reaction product (etching product) formed by etching from adhering to the free layer 16 because the free layer 16 is covered with the circumferential wall 20. Accordingly, a shortcircuit between the free layer 16 and fixed layer 14 can be prevented.

Practical examples of this RIE are halogen-based RIE and carbonyl-based RIE. The circumferential surface of the first stacked structure can be made almost perpendicular by using these RIE methods. On the other hand, these RIE methods allow the reaction product to readily adhere to the circumferential surfaces of the fixed layer 14 and tunnel barrier layer 15. Accordingly, the change in magnetic characteristic of the fixed layer 14 caused by the reaction product is favorably smaller than that of the fixed layer 18. This makes it possible to suppress the magnetic characteristic of the fixed layer 14 from changing from the desired characteristic, even when the reaction product adheres to the fixed layer 14 in the etching step performed by RIE. Note that in the etching step of this embodiment, the amount of the reaction product adhering to the circumferential surface of the second stacked structure is smaller than that of the reaction product adhering to the circumferential surface of the first stacked structure.

Figure 15:
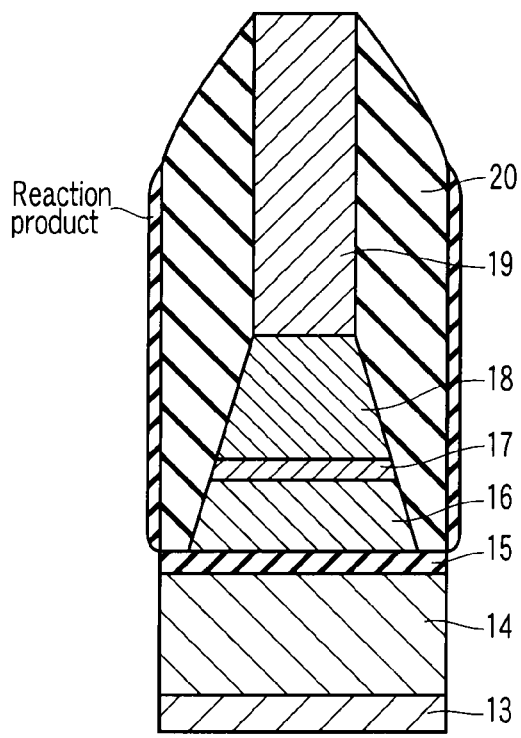
FIG. 15 is a sectional view showing a reaction product adhering to a circumferential wall 20.

Also, since carbonyl-based RIE is performed in an oxygen ambient, the first stacked structure (the lower electrode 13, fixed layer 14, and tunnel barrier layer 15) readily oxidizes. On the other hand, ion milling etching is not performed in an oxygen ambient, so the second stacked structure (the fixed layer 18, tunnel barrier layer 17, and free layer 16) hardly oxidizes. That is, in this embodiment, the circumferential surface of the second stacked structure oxidizes less than that of the first stacked structure. In addition, when the first stacked structure is etched by carbonyl-based RIE, the oxidized reaction product adheres to the circumferential wall 20. FIG. 15 is a sectional view showing the reaction product adhering to the circumferential wall 20. Note that FIG. 15 shows one of the MTJ elements 10 shown in FIG. 14.

Also, the damage to a sample by RIE is larger than that by ion milling. That is, in this embodiment, the first stacked structure is damaged more than the second stacked structure. If the damage caused by the process increases, the fixed layer cannot acquire the desired magnetic characteristic any longer. Therefore, the change in magnetic characteristic of the fixed layer 14 caused by the damage is favorably smaller than that of the fixed layer 18.

Then, as shown in FIGS. 1 and 2, an interlayer dielectric layer 21 is deposited on the entire device surface and etched back, thereby exposing the upper surfaces of the hard masks 19. Subsequently, a conductor (e.g., aluminum) is deposited on the hard masks 19, and the obtained conductive layer is patterned by lithography and RIE, thereby forming interconnection layers 22 running in the Y-direction. In this manner, the MRAM of this embodiment is formed.

In this embodiment as has been explained in detail above, the circumferential surface of the first stacked structure including the lower electrode 13, fixed layer 14, and tunnel barrier layer 15 is almost perpendicular to the film surfaces. On the other hand, the second stacked structure including the free layer 16, tunnel barrier layer 17, and fixed layer 18 has a tapered shape that narrows upward. This makes downsizing easier than when the whole MTJ element is tapered. That is, the processing conversion difference (the difference between the length of the hard mask 19 in the film surface direction and the length of the MTJ element 10 in the film surface direction) that is the conversion difference when processing the MTJ element 10 by using the hard mask 19 can be reduced to the double of the film thickness of the circumferential wall 20.

Also, since the free layer 16 is covered with the circumferential wall 20, it is possible to prevent the reaction product formed when etching the fixed layer 14 from adhering to the free layer 16. Consequently, a shortcircuit of the free layer 16 and fixed layer 14 can be prevented.

The first stacked structure including the free layer 16, tunnel barrier layer 17, and fixed layer 18 has a tapered shape. Therefore, a shortcircuit of the free layer 16 and fixed layer 18 can be suppressed.

Figure 16:
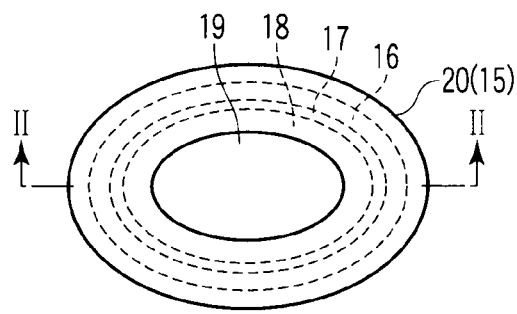
FIG. 16 is a plan view showing another example of the MTJ element 10.
Figure 17:
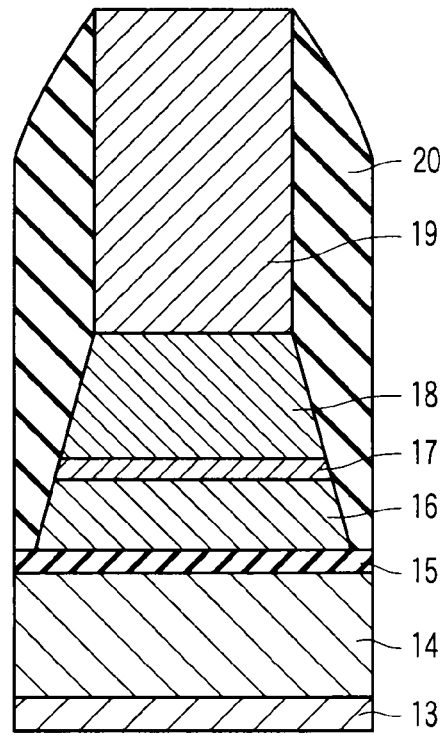
FIG. 17 is a sectional view of the MTJ element 10 taken along line II-II in FIG. 16.

Note that the planar shape of the MTJ element 10 is not particularly limited as described previously. The case where the planar shape of the MTJ element 10 is an ellipse will be explained below as another example. FIG. 16 is a plan view showing the other example of the MTJ element 10. FIG. 17 is a sectional view of the MTJ element 10 taken along line II-II in FIG. 16.

The planar shapes of the lower electrode 13, first fixed layer 14, first tunnel barrier layer 15, free layer 16, second tunnel barrier layer 17, second fixed layer 18, and upper layer 19 are ellipses.

Also, the circumferential surface of the first stacked structure including the lower electrode 13, fixed layer 14, and tunnel barrier layer 15 is almost perpendicular to the film surfaces. On the other hand, the second stacked structure including the free layer 16, tunnel barrier layer 17, and fixed layer 18 has a tapered shape that narrows upward. The circumferential wall 20 surrounds the circumferential surface of the stacked structure including the free layer 16, tunnel barrier layer 17, fixed layer 18, and hard mask 19. The circumferential wall 20 is formed on the tunnel barrier layer 15.

The film thickness t2 of the circumferential wall 20 is set to satisfy the condition described earlier. When this condition is met, the area of the bottom surface of the free layer 16 becomes smaller than the area of the tunnel barrier layer 15. That is, the circumferential wall 20 necessarily surrounds the circumferential surface of the free layer 16. This makes it possible to prevent a shortcircuit of the free layer 16 and fixed layer 14.

Even if the MTJ element 10 is formed as shown in FIGS. 16 and 17, the same effects as when the planar shape is a circle can be obtained. When forming the MTJ element 10 having an elliptic planar shape, the planar shape of the hard mask 19 need only be made elliptic or rectangular. The rest of the manufacturing process is the same as the manufacturing process described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
a first stacked structure formed by sequentially stacking a first fixed layer in which a magnetization direction is fixed and a first nonmagnetic layer;
a second stacked structure formed on the first stacked structure by sequentially stacking a free layer in which a magnetization direction is changeable, a second nonmagnetic layer, and a second fixed layer in which a magnetization direction is fixed; and
a circumferential wall formed in contact with a circumferential surface of the second stacked structure to surround the second stacked structure, and made of an insulator,
wherein a circumferential surface of the first stacked structure is substantially perpendicular, and
the second stacked structure has a tapered shape which narrows upward.

2. The element according to claim 1, wherein an area of a bottom surface of the second stacked structure is smaller than that of an upper surface of the first stacked structure.

3. The element according to claim 1, wherein letting t1 be a film thickness of the second stacked structure, t2 be a film thickness of the circumferential wall, and θ1 be a taper angle, a relationship indicated by $t2 > t1/\tan θ1$ is met.

4. The element according to claim 3, which further comprises an upper electrode formed on the second stacked structure and surrounded by the circumferential wall, and
in which an area of a bottom surface of the upper electrode is equal to that of an upper surface of the second stacked structure.

5. The element according to claim 4, wherein letting θ2 be a taper angle of an upper portion of the circumferential wall, and θ3 be a taper angle of a lower portion of the circumferential wall, a distance t3 from an upper surface of the first nonmagnetic layer to an inflection point at which θ2<θ3 satisfies t3>t1.

6. The element according to claim 5, wherein letting θ4 be a taper angle of the upper electrode, relationships indicated by $θ4 > θ1$, and $θ3 > θ1$ are met.

7. The element according to claim 1, wherein an amount of reaction product adhering to the circumferential surface of the second stacked structure is smaller than that of the first stacked structure.

8. The element according to claim 1, wherein a resistance of the second nonmagnetic layer is lower than that of the first nonmagnetic layer.

9. The element according to claim 1, wherein a hardness of the first nonmagnetic layer is higher than that of the second nonmagnetic layer.

10. The element according to claim 1, wherein a change in magnetic characteristic of the first fixed layer caused by a reaction product is smaller than that of the second fixed layer.

11. The element according to claim 1, wherein the circumferential surface of the second stacked structure has oxidized less than that of the first stacked structure.

12. The element according to claim 1, wherein a magnetic anisotropic energy per unit volume of the second fixed layer is higher than that of the first fixed layer.

13. The element according to claim 1, wherein a change in magnetic characteristic of the first fixed layer caused by damage is smaller than that of the second fixed layer.

14. The element according to claim 1, wherein a reaction product adhering to the circumferential wall has oxidized.

* * * * *